United States Patent
Yeh et al.

(10) Patent No.: US 9,299,593 B2
(45) Date of Patent: Mar. 29, 2016

(54) SEMICONDUCTOR DEVICE CLEANING METHOD AND APPARATUS

(75) Inventors: Ming-Hsi Yeh, Hsinchun (TW); Kuo-Sheng Chuang, Hsinchu (TW); Ying-Hsueh Chang Chien, New Taipei (TW); Chi-Ming Yang, Hsian-San District (TW); Chin-Hsiang Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 956 days.

(21) Appl. No.: 13/210,998

(22) Filed: Aug. 16, 2011

(65) Prior Publication Data

US 2013/0045606 A1    Feb. 21, 2013

(51) Int. Cl.
*H01L 21/00*    (2006.01)
*H01L 21/67*    (2006.01)
*B08B 3/02*    (2006.01)

(52) U.S. Cl.
CPC .......... *H01L 21/67051* (2013.01); *B08B 3/024* (2013.01)

(58) Field of Classification Search
CPC .............. H01L 21/67051; B05B 13/04; B05B 13/0271; B05B 13/0426; B08B 3/024; B08B 3/022; B05C 5/0287
USPC ............................ 134/33, 99.1, 149; 239/551
See application file for complete search history.

(56) References Cited

U.S. PATENT DOCUMENTS

| | | | |
|---|---|---|---|
| 5,578,529 A * | 11/1996 | Mullins ................. | B24B 37/005 134/33 |
| 5,853,961 A | 12/1998 | Sakai et al. | |
| 5,887,605 A | 3/1999 | Lee et al. | |
| 5,967,156 A * | 10/1999 | Rose ...................... | B08B 7/0092 134/7 |
| 6,384,894 B2 * | 5/2002 | Matsuyama .......... | G03F 7/3021 355/100 |
| 6,533,864 B1 * | 3/2003 | Matsuyama ........ | H01L 21/6715 118/500 |
| 6,594,847 B1 | 7/2003 | Krusell et al. | |
| 6,824,621 B2 | 11/2004 | Shibagaki | |
| 2008/0035962 A1 * | 2/2008 | Kim .................... | H01L 29/4236 257/288 |
| 2008/0156346 A1 | 7/2008 | Wang et al. | |
| 2009/0205677 A1 * | 8/2009 | Thakur ................... | B08B 3/024 134/1 |

(Continued)

FOREIGN PATENT DOCUMENTS

JP    WO 2010116691 A1 * 10/2010 .............. B08B 3/022
WO   WO 2010116691 A1 * 10/2010 ................ B08B 3/02

OTHER PUBLICATIONS

Manish Chandhok; Kent Frasure; E. Steve Putna; Todd R. Younkin; Willy Rachmady; Uday Shah and Wang Yueh; "Improvement in Linewidth Roughness by Postprocessing;" Nov./Dec. 2008; pp. 2265-2270; J. Vac. Sci. Technol. B 26(6); American Vacuum Society.

Dan Syverson; "Implant Stripping: Steam Injection for Uniform Wet Stripping;" 2010; Issue II; pp. 20-23; www.euroasiasemiconductor.com.

Ming-Hsi Yeh; Yu-Fu Lin; Shao-Yen Ku; Chi-Ming Yang and Chin-Hsiang Lin; "Cleaning Process for Semiconductor Device Fabrication:" U.S. Appl. No. 13/022,931, filed Feb. 8, 2011; 19 Pages.

(Continued)

*Primary Examiner* — Michael Kornakov
*Assistant Examiner* — Katelyn Whatley
(74) *Attorney, Agent, or Firm* — Haynes and Boone, LLP

(57) ABSTRACT

A method includes providing a wafer and providing a first spray bar spaced a distance from the wafer. A first spray is dispensed from the first spray bar onto a first portion (e.g., half) of the wafer. Thereafter, the wafer is rotated. A second spray is dispensed from the first spray bar onto a second portion (e.g., half) of the rotated wafer. In embodiments, a plurality of spray bars are positioned above the wafer. One or more of the spray bars may be tunable in separation distance and/or angle of dispensing.

14 Claims, 7 Drawing Sheets

(56) References Cited

U.S. PATENT DOCUMENTS

2010/0029088 A1* 2/2010 Mayer .................. C23F 1/08
438/748
2010/0163078 A1* 7/2010 Hsu .................. H01L 21/67051
134/33

OTHER PUBLICATIONS

Ming-Hsi; Kuo-Sheng Chuang; Ying-Hsueh Chien; Chi-Ming Yang; Chi-Wen Liu and Chin-Hsiang Lin; "Chemical Dispersion Method and Device;" U.S. Appl. No. 13/198,420, filed Aug. 4, 2011; 25 Pages.

* cited by examiner

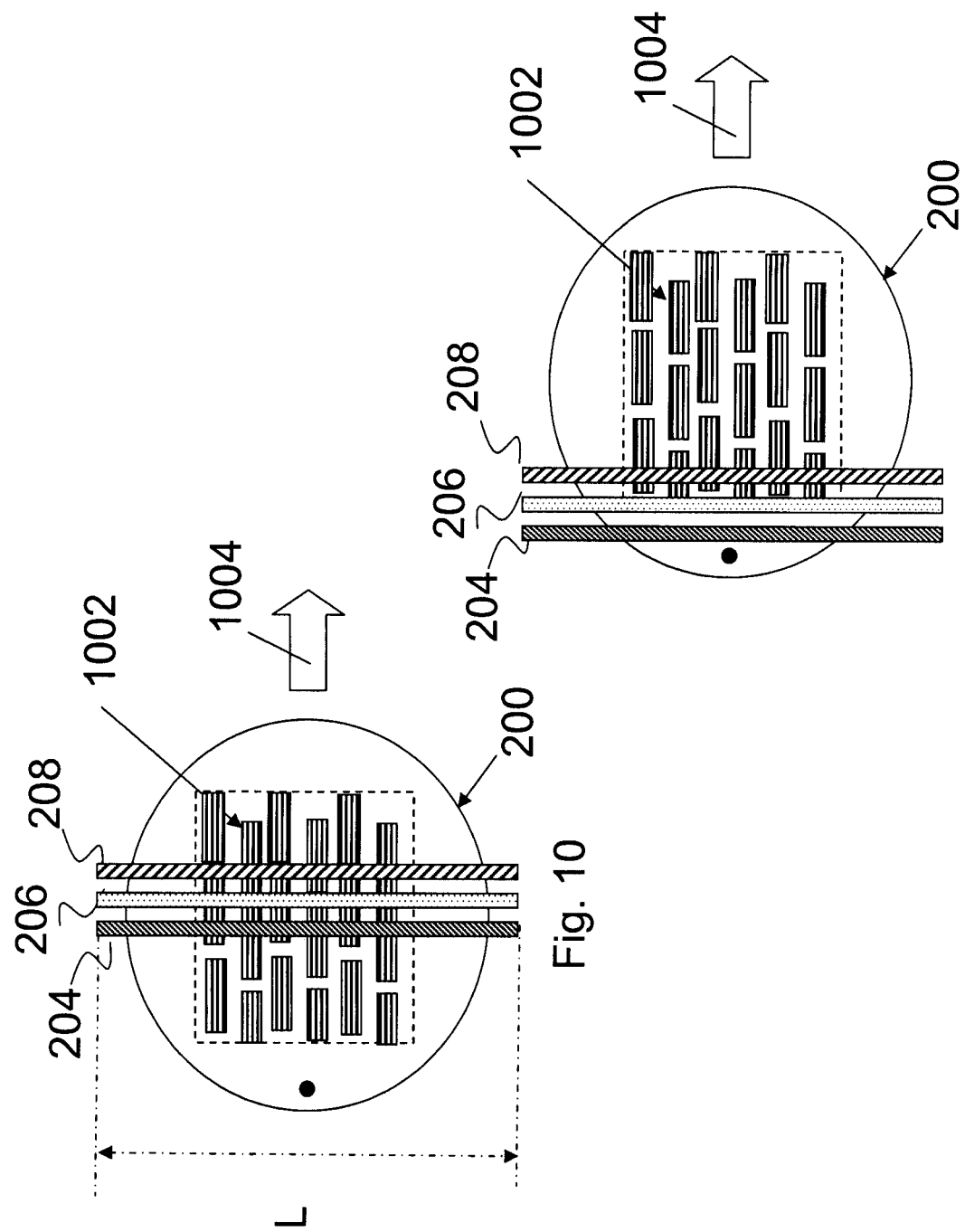

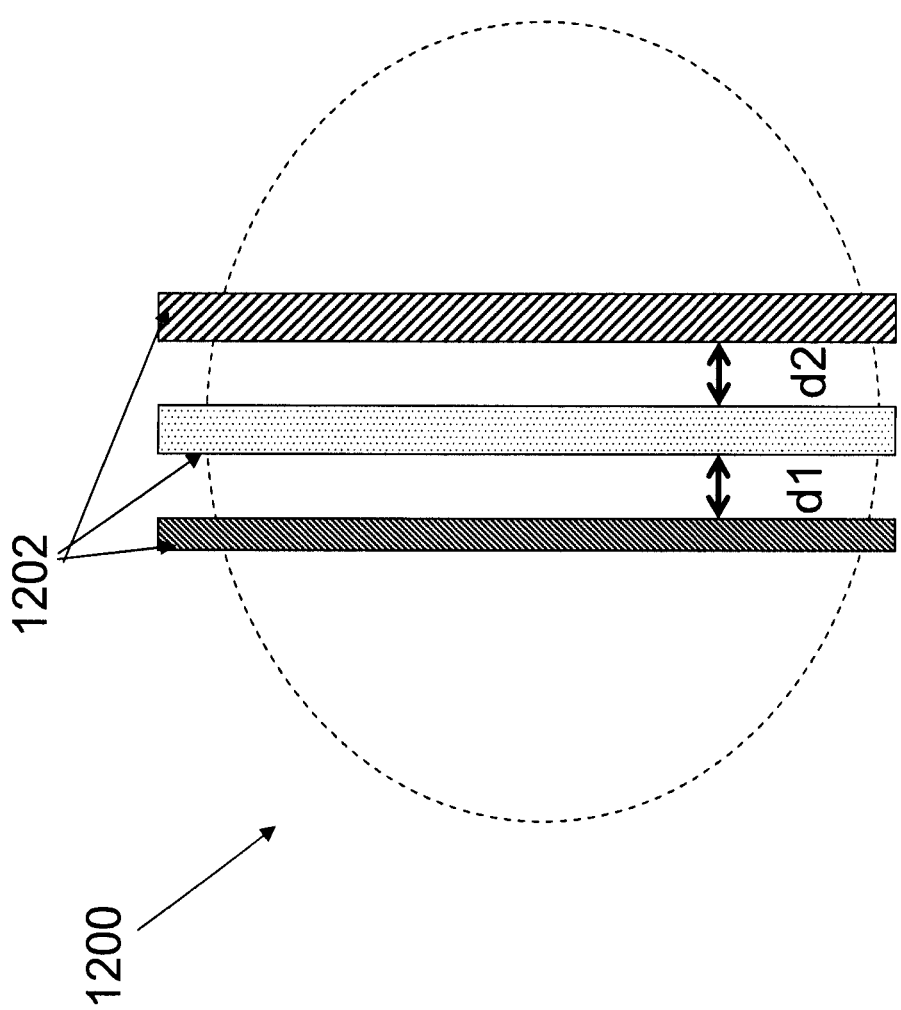

SEMICONDUCTOR DEVICE CLEANING METHOD AND APPARATUS

BACKGROUND

Embodiments of this disclosure relate generally to semiconductor fabrication, and more particularly to a method and apparatus for cleaning a semiconductor wafer.

In the course of integrated circuit (IC) evolution, the density of IC devices has increased as the feature sizes decrease. Though this has resulted in many performance and cost benefits, it has also increased the complexity of fabrication of the ICs. For example, contamination control has become more critical as the small feature size allows not only for smaller particles to be detrimental to the performance of the IC, but for the features to become more fragile with the decreasing size and pattern complexity. Contamination control is further challenged by the increases in semiconductor wafer diameter.

There is a trade-off that must be considered between particle removal efficiency and sustaining a pattern damage free process. Conventionally, particle removal needed to be sacrificed in order to maintain the pattern fidelity. However, this can lead to quality, reliability, and yield concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 10 and 11 illustrate a top view of an embodiment of a pattern orientation on a wafer during a cleaning process.

FIG. 12 is a top view illustrating an embodiment of a cleaning apparatus according to one or more aspects of the present disclosure.

DETAILED DESCRIPTION

Figure 1:
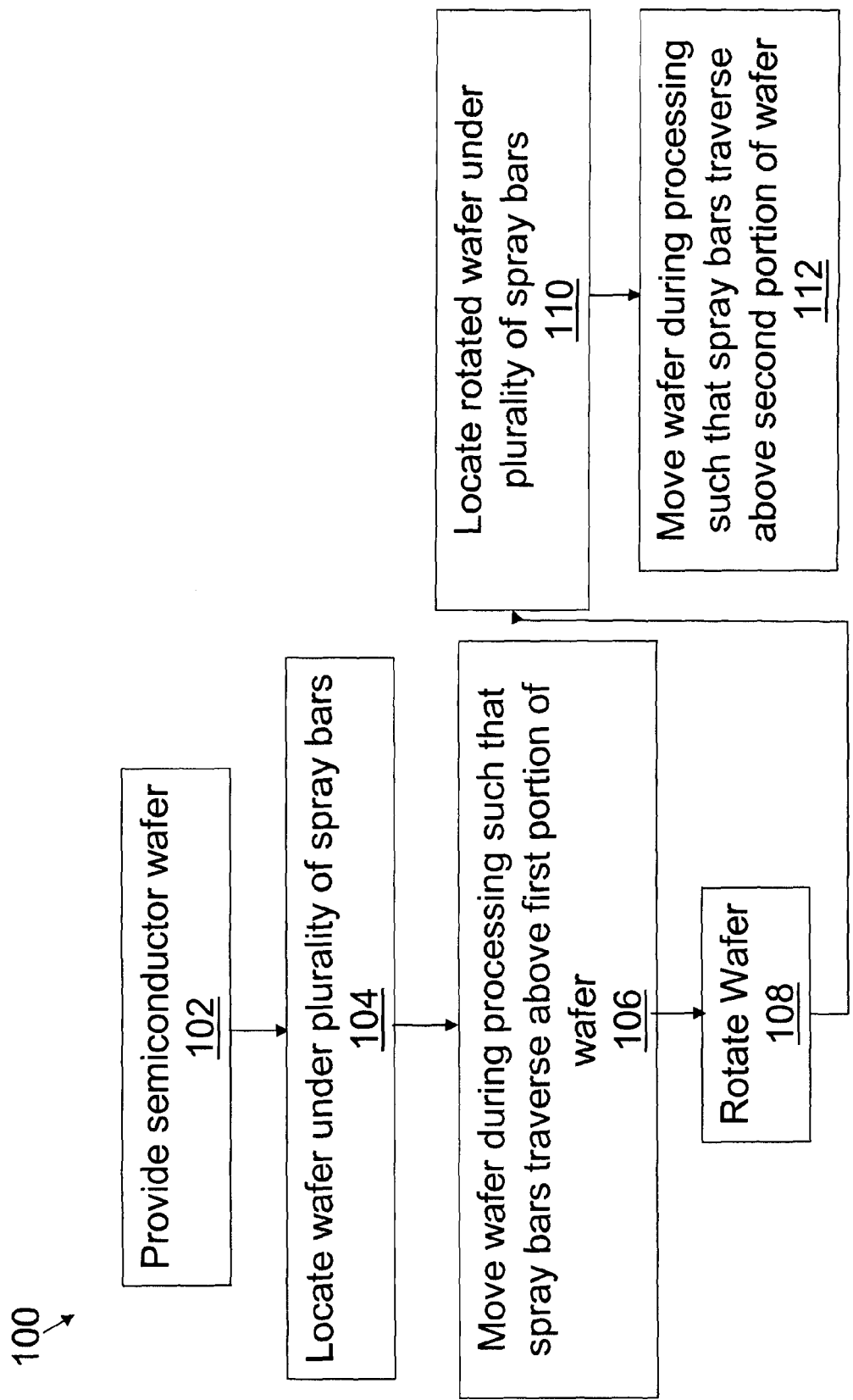
FIG. 1 is a flow chart illustrating an embodiment of a cleaning process according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure is directed, at times, to integrated circuit device or semiconductor device manufacturing. However, one would recognize the benefits of the present disclosure can be applied in other device technologies, such as liquid crystal display (LCD) and/or any other technology which require similar dispersion of chemicals onto and/or cleaning of a substrate. The term chemical as used herein includes any liquid or gaseous substance including water, nitrogen, pure chemicals, mixtures, solutions, and the like.

Referring now to FIG. 1, illustrated is a method 100 of cleaning a semiconductor wafer. FIGS. 2, 3, 4, and 5 and corresponding FIGS. 6, 7, 8, and 9 are embodiments of a semiconductor wafer 200 illustrated during various stages of the cleaning process of FIG. 1.

The method 100 begins at block 102 where a semiconductor substrate (e.g., wafer) is provided. The wafer may have one or more layers or features formed thereon. In an embodiment, the wafer has a pattern of features formed thereon, such as discussed below with reference to FIGS. 10 and 11. In an embodiment, the wafer has a diameter of approximately 450 mm.

Figure 2:
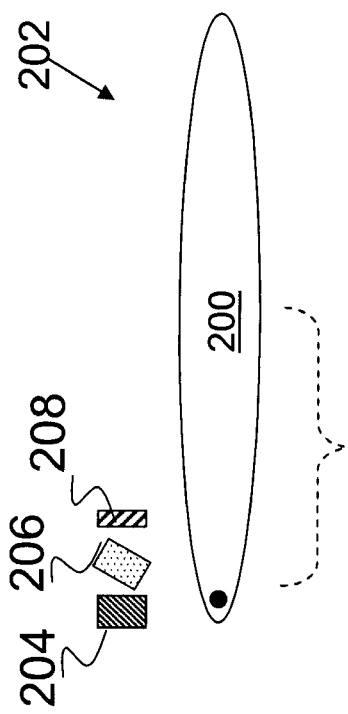
FIGS. 2, 3, 4, and 5 are perspective views illustrating various steps of an embodiment of the method of FIG. 1.
Figure 6:
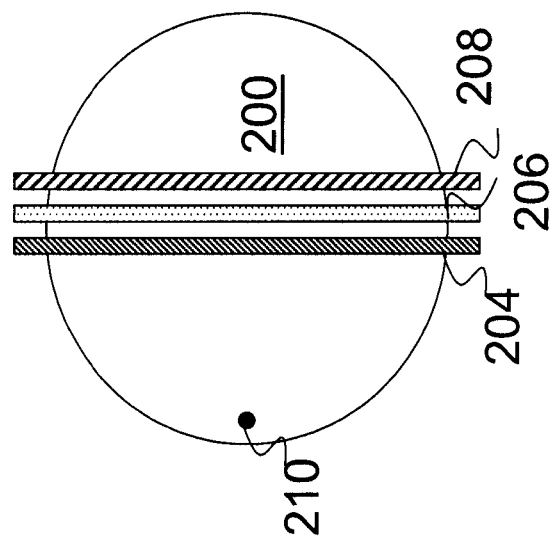

Referring to the example of FIGS. 2 and 6, a wafer 200 is illustrated. The wafer 200 may include silicon. Alternatively, the wafer 200 includes germanium, silicon germanium or other proper semiconductor materials. The wafer 200 may include regions where one or more semiconductor devices, or portions thereof, are formed (e.g., field effect transistors). Various isolation features may be formed in the wafer 200 interposing various doped regions (e.g., n-wells and p-wells) formed in various active regions. The wafer 200 includes a plurality of individual die formed thereon, which may be subsequently diced to form semiconductor devices. In an embodiment, the wafer 200 is approximately 450 mm in diameter. The wafer 200 may include a pattern such as a pattern 1002, described below with reference to FIGS. 10 and 11. The pattern 1002 may be associated with a semiconductor device or portion thereof, such as a plurality of gate structures (e.g., polysilicon features), a plurality of interconnect lines, dummy features, and/or other suitable patterns.

The wafer 200 as illustrated includes an alignment mark 210. The alignment mark 210 is illustrated for ease of reference in the following figures and may signify any point and/or feature on the wafer 200.

The method 100 then proceeds to block 104 where the wafer is positioned in a cleaning apparatus spaced apart from (e.g., under) a plurality of spray bars. The cleaning apparatus may be a single-wafer spray tool. The plurality of spray bars may include a chemical dispensing spray bar, an isopropyl alcohol (IPA) dry spray bar, a spray bar configured to provide an atomized spray, a physics force spray bar, and/or other suitable spray bars. The wafer may be positioned such that a spray (e.g., chemical dispersed) from one or more of the spray bars is incident a center region of the wafer. In an embodiment, the cleaning apparatus includes a single spray bar.

Referring to the example of FIGS. 2 and 6, the wafer 200 is positioned in a chamber 202 of a single-wafer cleaning apparatus. The apparatus includes a first spray bar 204, a second spray bar 206, and a third spray bar 208. The wafer 200 is positioned such that a front side of the wafer 200 (including a pattern associated with a semiconductor device) is facing an outlet of each of the spray bars 204, 206, 208. In an embodiment, the first spray bar 204 is a chemical dispensing bar. The first spray bar may dispense one or more chemicals suitable for cleaning and/or etching a portion of the wafer 200. In an embodiment, the cleaning solution known as SC1 (de-ionized water (DI), NH$_4$OH, H$_2$O$_2$) is dispensed from the first spray bar 204. In other embodiments, the first spray bar 204 dispenses DI and/or diluted NH$_4$OH. Other example suitable chemicals include DI, SC2 (DI, HCl, H$_2$O$_2$), ozonated de-ionized water (DIWO$_3$), SPM (H$_2$SO$_4$, H$_2$O$_2$), SOM (H$_2$SO$_4$, O$_3$), SPOM, H$_3$PO$_4$, dilute hydrofluoric acid (DHF), HF, HF/EG, HF/HNO$_3$, NH$_4$OH, and tetramethylammonium hydroxide (TMAH). The chemical dispensed by the first spray bar 204 may be between approximately 0 degrees Celsius and approximately 250 degrees Celsius.

The spray bar 206 may be a physics force spray bar. The physics force spray bar may provide a gas flow such as an atomized spray. The gas in the gas flow includes inert gas such as nitrogen, helium, and/or argon. In an embodiment, the physics force spray bar dispenses N$_2$ gas. The N$_2$ gas dispensed may be a high pressure flow. The N$_2$ gas flow rate may be between approximately 0 L/min and approximately 70 L/min. Other examples of chemical dispersed by the spray bar 206 include argon and/or air under high pressure flow.

The spray bar 208 may be an IPA dry spray bar. The IPA dry bar includes an isopropyl alcohol flow. The IPA dry spray bar may dispense a flow suitable for rinsing and/or drying the wafer 200. The IPA dry bar 208 may serve to remove a chemical (e.g., SC1, water) from the wafer 200 surface. The chemical spray dispensed by the IPA dry spray bar 208 may be between approximately 0 degrees Celsius and approximately 250 degrees Celsius.

The configuration of spray bars 204, 206 and 208 is exemplary only and in different embodiments any plurality of spray bars having any plurality of functionalities, now known or later developed, may be possible and within the scope of the present disclosure. In an embodiment, the spray bars have a tunable distance of separation, such as discussed below with reference to FIG. 12. In an embodiment, one or more of the spray bars may includes a tunable angle of dispensing, such as discussed below with reference to FIG. 13.

The method 100 then proceeds to block 106 where the wafer is moved laterally under the spray bars. The spray bars may dispense a spray of one or more chemicals while the wafer is moved under the bars (e.g., cleaning solution, water, IPA, atomized, pressurized N$_2$). The wafer may be moved at a speed between approximately 4 mm/second and approximately 100 mm/second. The wafer may be moved such that its surface remains substantially planar and passes underneath the plurality spray bars. In an embodiment, the wafer is located such that spray bars lie substantially over the center region of the wafer. The wafer is then moved in block 106 such that the spray bars are disposed over an edge of the wafer (or beyond the edge of the wafer). Thus, the spray(s) dispensed from the spray bar(s) is incident the surface of the wafer on a portion (e.g., half) of the wafer.

Figure 3:
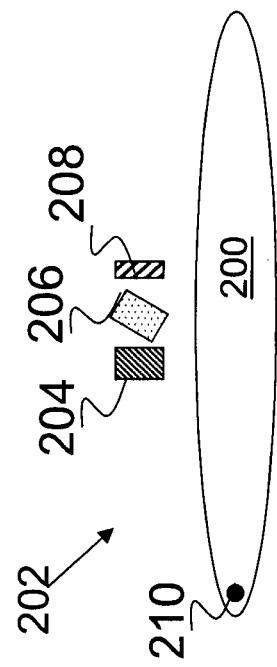
Figure 7:
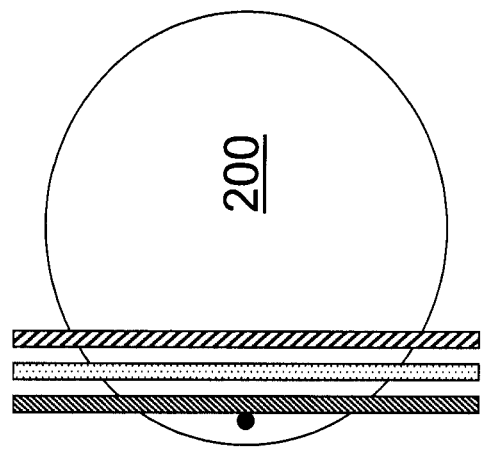
FIGS. 6, 7, 8, and 9 illustrate corresponding top views of an embodiment of the method of FIG. 1.

Referring to the example of FIGS. 3 and 7, illustrated is the wafer 200 moved to the right of the figure such that the spray bars 204, 206, 208 traverse above a first portion 302 of the wafer 200. Thus, the first portion 302 has been "cleaned"— the spray from one or more of the spray bars 204, 206, and 208 being incident the surface of the first portion 302 of the wafer 200. It is noted that the movement of the wafer 200 is relative and can be either direction ("left" or "right") such that the spray bars provide a chemical(s) to portion of the wafer 200.

In an embodiment, the spray bars have a tunable distance of separation, such as discussed below with reference to FIG. 12. In a further embodiment, during the dispensing of block 106, the distance of separation between spray bars (e.g., 204, 206, 208) may be altered. In an embodiment, one or more of the spray bars include a tunable angle of dispensing, such as discussed below with reference to FIG. 13. In a further embodiment, during the dispensing of block 106, the angle of one or more of the spray bars (e.g., physic spray bar 206) may be altered.

Figure 4:
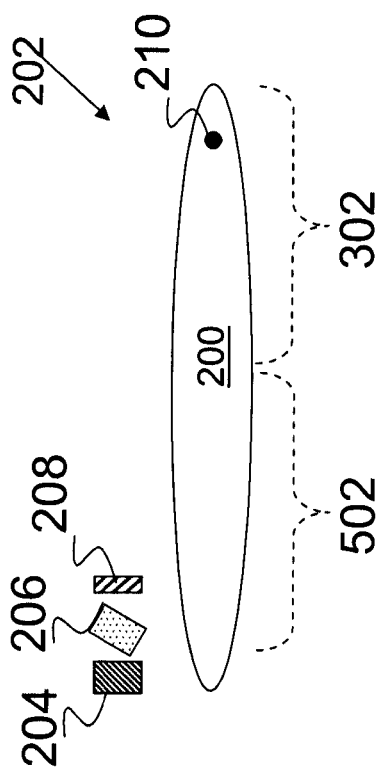
Figure 8:
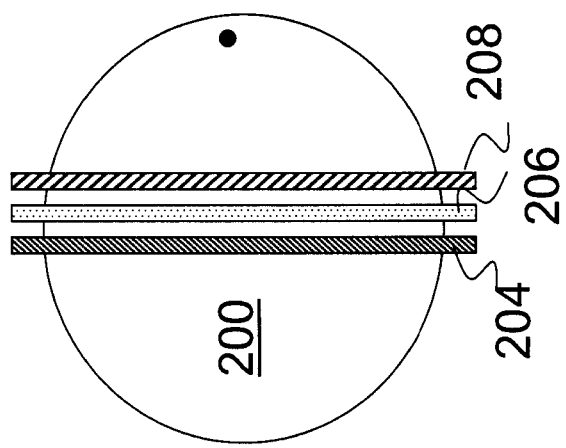

The method 100 then proceeds to block 108 where the wafer is rotated. The wafer may be rotated 180 degrees such that the top surface of the wafer remains under the spray bars. As illustrated in FIGS. 4 and 8, the wafer 200 has been rotated approximately 180 degrees. The alignment mark 210 now disposed to the "right" of the spray bars 204, 206, 208. The rotation of the wafer 200 may be performed by a suitable wafer stage of the cleaning apparatus. In an embodiment, the spray is stopped during the rotation of the wafer.

The method 100 then proceeds to block 110 where the wafer is again disposed under the plurality of spray bars. The wafer may be positioned such that the spray bar(s) are located substantially over the center of the wafer. In an embodiment, block 110 and block 108 occur simultaneously. The movement of the wafer 200 may be performed by a suitable wafer stage of the cleaning apparatus.

Referring to the example of FIGS. 4 and 8, the spray bars 204, 206, and 208 are now located over, substantially, the center region of the wafer 200. As described above, the wafer 200 has been rotated. In an embodiment, an angle of one or more of the spray bars 204, 206, and/or 208 has been altered from that provided above in block 106, as discussed below with reference to FIG. 13. In an embodiment, a distance of spacing between one or more of the spray bars 204, 206, and/or 208 has been altered from that provided above in block 106, as discussed below with reference to FIG. 12.

The method 100 then proceeds to block 112 where the wafer is moved during the processing such that the spray bar traverses over a second portion (e.g., half) of the wafer (e.g., moving such that the spray bars are then over an edge of the wafer (or beyond the edge of the wafer)). The spray bars may dispense one or more chemicals while the wafer is moved under the bars (e.g., cleaning solution, water, IPA, atomized, pressurized N$_2$). The wafer may be moved at a speed between approximately 4 mm/second and approximately 100 mm/second. Thus, the spray(s) dispensed from the spray bar is incident on portion of the wafer. In an embodiment, this is a different portion than provided in block 106.

Figure 5:
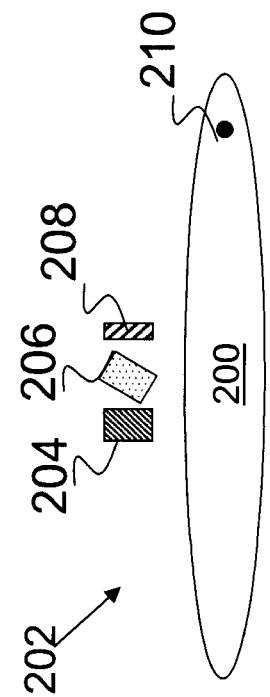
Figure 9:
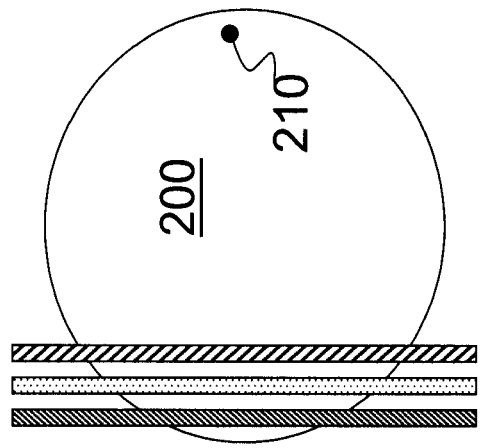

Referring to the example of FIGS. 5 and 9, illustrated is the wafer 200 moved to the right of the figure such that the spray bars 204, 206, 208 traverse above a second portion 502 of the wafer 200. The spray bars 204, 206 and 208 traverse from approximately the center region to an edge region (an opposing edge region than described above with reference to FIG. 3). Thus, the second portion 502 has been "cleaned"—the spray from one or more of the spray bars 204, 206, and 208 being incident the surface of the second portion 502 as the bars traverse above the second portion 502, after the wafer 200 has been rotated. It is noted that the movement of the wafer is relative and can be either direction ("left" or "right") such that the spray bars provide a chemical(s) to portion of the wafer 200.

In an embodiment, the spray bars have a tunable distance of separation, such as discussed below with reference to FIG. 12. In a further embodiment, during the dispensing of block 112, the distance of separation between spray bars (e.g., 204, 206, 208) may be altered. In an embodiment, one or more of the spray bars may includes a tunable angle of dispensing, such as discussed below with reference to FIG. 13. In a further embodiment, during the dispensing of block 112, the angle of one or more of the spray bars (e.g., physic spray bar 206) may be altered.

Thus, the method 100 provides for cleaning the entire surface of the wafer 200, first cleaning a first portion (illustrated as 302) and subsequently cleaning a second portion (illustrated as 502). It is noted that one or more regions of the wafer 200 may be included in the first portion 302 and the second portion 502 (e.g., the first portion 302 and the second portion 502 may overlap).

It is noted that in the discussion above, the method 100 is illustrated as providing the wafer moving (e.g., to the relative right on the figures). This is merely one implementation of the method 100, which may rely on any relative movement of the wafer and spray bars. For example, in other embodiments, the wafer may be moved in an opposing direction, the spray bars may be moved while the wafer remains stationary, both the spray bars and the wafer may be moved, and/or other suitable configurations such that a first portion of the wafer is cleaned and subsequently, a second portion of the wafer is cleaned. The wafer may be rotated between passes (e.g., first and second portion cleaning).

The method 100 may be an iterative process repeating the passes of the cleaning process(es). In other embodiment, the wafer 200 may be moved to subsequent semiconductor fabrication process such as, for example, photolithography, etching, deposition, and implantation. The method 100 may be performed at a temperature of between approximately 0 C and approximately 250 C.

Referring now to FIGS. 10 and 11, illustrated is the wafer 200 having a pattern 1002 formed thereon. The wafer 200 is positioned in a single wafer cleaning apparatus having a plurality of spray bars 204, 206, and 208. The single wafer cleaning apparatus may be substantially similar to as discussed above with reference to FIGS. 1-9. The wafer 200 is moved in a direction 1004 such that the spray bars 204, 206, and 208 traverse above the wafer 200 (e.g., one portion of the wafer 200, as described above with reference to block 106 and/or block 112). FIGS. 10 and 11 illustrate that the direction of the movement of the wafer 200, depicted as arrow 1004, is substantially parallel to that of the orientation of the features of the pattern 1002. The pattern 1002 includes features that are substantially perpendicular to a length L of the spray bars 204, 206, and 208, which traverses the wafer 200 diameter. The pattern 1002 may include a plurality of gates, dummy features, interconnect lines, and/or other features. The pattern 1002 may include a substantially repeating pattern of features. In an embodiment, the pattern 1002 is a plurality of polysilicon lines. The polysilicon lines may form a gate structure or portion thereof. The pattern 1002 may include a plurality of features arranged such that a plurality of passages (or "streets") is formed between the features which traverse the wafer 200 from one edge to an opposing edge. These passages may be disposed substantially parallel to the movements 1004 of the wafer 200. FIG. 10 illustrates the spray bars 204, 206, and 208 above the wafer 200 in substantially centered position. FIG. 11 illustrates the spray bars 204, 206 and 208 after the wafer 200 has traversed to the right.

As described above, the wafer 200 movement illustrates to the "right" is relative only and not intended to imply any absolute direction. Furthermore, the movement may include any relative movement of the wafer 200 and the spray bars 204, 206, and/or 208. For example, the wafer 200 may move, the spray bars 204, 206, and/or 208 may move, or each of the components may move.

In an embodiment, the wafer 200 having the pattern 1002 is then rotated approximately 180 degrees. In such an embodiment, the spray bars may again be substantially perpendicular the pattern 1002. In an embodiment, a second portion of the wafer 200 including the pattern 1002 may be cleaned. The second portion of the wafer 200 may be cleaned by moving the wafer 200 under the spray of the spray bars 204, 206, 208 in a direction substantially parallel the passages of the pattern 1002.

It is noted that FIGS. 10 and 11 illustrate an advantage of one or more of the embodiments described herein. The pattern is oriented perpendicular to the spray bar, and as such the particles that are to be cleaned from the wafer may be moved across the wafer through passages defined by pattern (e.g., the streets or openings of the pattern). Other advantages of certain embodiments include lessening the damage to the pattern from the cleaning process.

Referring now to FIG. 12, illustrated is an embodiment of a cleaning apparatus 1200. The cleaning apparatus 1200 may be used to perform the method 100. The cleaning apparatus 1200 includes a plurality of spray bars 1202. A wafer, shown in dotted outline, may be positioned such that a front side of the wafer (including a pattern associated with a semiconductor device) is facing an outlet of each of the plurality of spray bars 1202. The plurality of spray bars may include a chemical dispensing bar, a physics force bar, an IPA dry bar, and/or suitable dispensing bars. The plurality of spray bars may be substantially similar to the bars 204, 206 and/or 208, described above with reference to FIGS. 2-9. The wafer may be substantially similar to the wafer 100, also described above.

The plurality of spray bars 1202 are spaced a distance d1 and d2, respectively, from each other. In an embodiment, the distance d1 and/or distance d2 is a programmable distance. The distance d1 and/or d2 may be altered during the processing of a single wafer. In other embodiments, the distance d1 and/or d2 may vary between processing of different wafers. The distance d1 and/or d2 may be determined using characterization data, experimental data, models, and/or other suitable means. The distance d1 and/or d2 may be determined based on the diameter of the wafer to be processed, the type of pattern disposed on the wafer to be processed, defect goals for the wafer to be processed, the product associated with wafer to be processed, criticality of the pattern, susceptibility of the pattern to damage, and/or other suitable metrics.

In an embodiment the distance d1 and/or the distance d2 may be tunable between approximately 0 mm and approximately 50 mm. The plurality of spray bars 1202 are exemplary only and may include any number of spray bars. Advantages of some embodiments of the apparatus 1200 include enlarging the process window for the cleaning process to be performed with reduced damage to the pattern.

Figure 13:
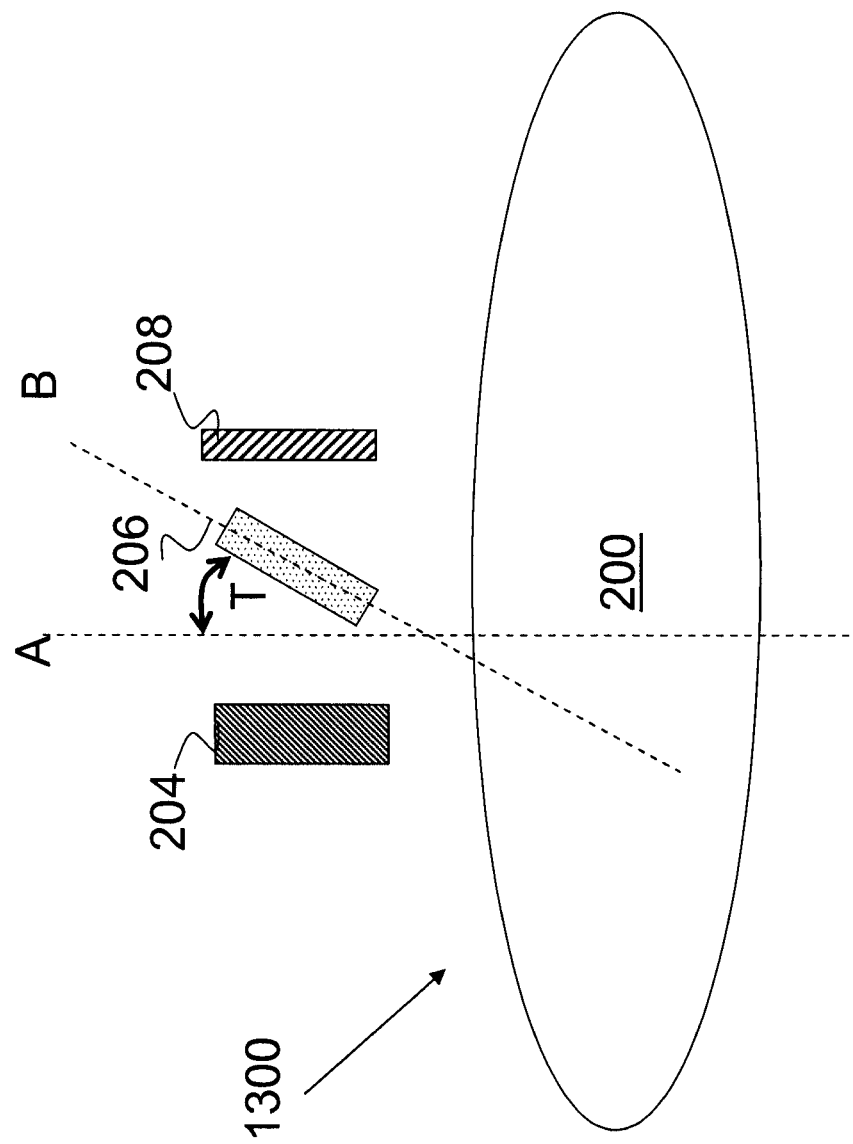
FIG. 13 illustrates another embodiment of a cleaning apparatus according to one or more aspects of the present disclosure.

Referring now to FIG. 13, illustrates is a cleaning apparatus 1300. The cleaning apparatus 1300 may be substantially similar to the apparatus described above with reference to FIGS. 2-9. The cleaning apparatus 1300 may be used to perform the method 100, described above with reference to FIG. 1. The cleaning apparatus 1300 includes a plurality of spray bars 204, 206, and 208. A wafer 200, which may be substantially similar to as discussed above with reference to FIGS. 2-9 and/or 10 and 11, is disposed under the spray bars 204, 206, and 208. The wafer 200 is positioned such that a front side of the wafer 200 (including a pattern associated with a semiconductor device) is facing an outlet of each of the spray bars 204, 206, 208.

In an embodiment, the first spray bar 204 is a chemical dispensing bar. The first spray bar may dispense one or more chemicals suitable for cleaning and/or etching a portion of the wafer 200. Example compositions include SC1 (de-ionized water (DI), $NH_4OH$, $H_2O_2$), DI, diluted $NH_4OH$, SC2 (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, tetramethylammonium hydroxide (TMAH) The chemical dispensed by the first spray bar 204 may be between approximately 0 degrees Celsius and approximately 250 degrees Celsius. The spray bar 208 may be an IPA dry spray bar. The IPA dry bar includes an isopropyl alcohol flow. The IPA dry bar 208 may serve to remove a chemical (e.g., SC1, water) from the wafer 200 surface.

The spray bar 206 may be a physics force spray bar. The physics force spray bar 206 may provide an atomized spray. In an embodiment, the physics force spray bar dispenses $N_2$ gas. The $N_2$ gas dispensed may be a high pressure flow. The $N_2$ gas flow rate may be between approximately 0 L/min and approximately 70 L/min. Other examples of chemical dispersed by the spray bar 206 include argon and/or air under high pressure flow. The spray bar 206 may be disposed above the wafer 200 at an angle T (dispersion angle). The angle T may be the angle between a perpendicular line A drawn perpendicular to the surface of the wafer 200 and a line B drawn through the center of the nozzle of the spray bar 206. The angle T may also be referred to as a dispersion angle, being the angle at which a nozzle of the spray bar 206 disperses a spray.

In an embodiment, the angle T is a programmable angle. The angle T may be altered during the processing of a single wafer. In other embodiments, the angle T may vary between processing of different wafers. The angle T may be determined using characterization data, experimental data, models, and/or other suitable means. The angle T may be determined based on the diameter of the wafer to be processed, the type of pattern disposed on the wafer to be processed, defect goals for the wafer to be processed, the product associated with wafer to be processed, and/or other suitable metrics. In an embodiment, the angle T may vary between the first pass of a cleaning process and a second pass of a cleaning process (e.g., block 106 and 112). Advantages of a variable angle T (e.g., tunable angle) include an enlarged processing window for pattern damage free cleaning process(es). In an embodiment, the angle T may be tunable between approximately 0 degrees and approximately 60 degrees.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Some embodiments described in the foregoing description provide for apparatus and/or methods that allow for improved cleaning of a wafer, while decreasing the damage to the pattern provided on the wafer. Flexible positioning of the spray bars may allow for improved process tuning, tunable angle spray bars that may improve the process window for the fabrication, and/or other features.

Thus, provided in a method of semiconductor fabrication. The method includes providing a wafer and providing a first spray bar spaced a distance from the wafer. A first spray is dispensed from the first spray bar onto a first portion of the wafer. Thereafter, the wafer is rotated. A second spray is dispensed from the first spray bar onto a second portion of the rotated wafer.

In another embodiment, a method is described which includes placing a wafer under a plurality of spray bars such that the plurality of spray bars overlies a center region on the wafer. A spray is dispensed from each of the plurality of spray bars onto the wafer. While dispensing the spray, the wafer is moved such that the plurality of spray bars traverse above a first portion of the wafer. After the dispensing, the wafer is rotated and the plurality of spray bars is positioned over the center region of the wafer. A spray is then dispensed from each of the plurality of spray bars onto the rotated wafer. While dispensing the spray on the rotated wafer moving the rotated wafer such that the plurality of spray bars traverse above a second portion of the wafer.

Also described is an embodiment of an apparatus. The apparatus includes a plurality of spray bars positioned above the wafer. The plurality of spray bars is tunable. In an embodiment, the distance between spray bars in variable. In an embodiment, the angle of dispensing of at least one of the plurality of spray bars is variable (e.g., a physics force bar which may provide an atomized flow).

What is claimed is:

1. A method of semiconductor fabrication, the method comprising:
   providing a wafer having a pattern includes a plurality of repeating features, wherein each repeating features is extending in a first direction, wherein the plurality of repeating features include one of gate structures and interconnect lines of a semiconductor device;
   providing a first spray bar spaced a distance from the wafer and having a length extending in a second direction perpendicular to the first direction;
   dispensing a first cleaning chemical spray from the first spray bar onto an entirety of a first portion of the wafer while maintaining the wafer at a first orientation and while not rotating the wafer, wherein the first portion is defined from a center point to a first edge of the wafer, wherein during the dispensing the first cleaning chemical spray traverses the first portion in the first direction;
   after completing the dispensing of the first cleaning chemical spray, rotating the wafer to a second orientation; and
   dispensing a second cleaning chemical spray from the first spray bar onto an entirety of a second portion of the rotated wafer while maintaining the wafer at the second orientation and while not rotating the wafer, wherein the second portion is defined from the center point to a second edge of the wafer, the second edge opposing the first edge, wherein the first cleaning chemical spray is not incident the second portion of the wafer and wherein the second cleaning chemical spray is not incident the first portion of the wafer.

2. The method of claim 1, wherein the first cleaning chemical spray includes de-ionized water (DI), NH4OH, and H2O2.

3. The method of claim 1, wherein the first cleaning chemical spray includes N2.

4. The method of claim 1, wherein the first cleaning chemical spray includes isopropyl alcohol (IPA).

5. The method of claim 1, wherein the moving from the first orientation to the second orientation includes rotating the wafer 180 degrees.

6. The method of claim 1, further comprising:
   providing a second spray bar;
   dispensing a third cleaning chemical spray from the second spray bar onto the first portion of the wafer while dispensing the first cleaning chemical spray; and
   dispensing a fourth cleaning chemical spray from the second spray onto the second portion of the wafer while dispensing the second cleaning chemical spray.

7. The method of claim 6, wherein the providing the second spray bar includes altering a distance between the first and second spray bars.

8. The method of claim 1, further comprising:
altering an angle of dispersion of the first spray bar.

9. The method of claim 1, wherein the first and second cleaning chemical spray include the same chemical composition.

10. The method of claim 1, wherein the dispensing the first cleaning chemical spray from the first spray bar onto the first portion of the wafer includes laterally moving, in the first direction, the wafer relative to the first spray bar while maintaining the first orientation.

11. The method of claim 1, wherein the dispensing the first cleaning chemical spray from the first spray bar onto the first portion of the wafer includes laterally moving, in the first direction, the wafer relative to the first spray bar such that the first cleaning chemical spray is initially incident a center region of the wafer and subsequently incident a first edge region of the wafer, while maintain the first orientation.

12. The method of claim 11, wherein the dispensing the second cleaning chemical spray from the first spray bar onto the second portion of the wafer includes moving the wafer relative to the first spray bar and in a third direction such that the second cleaning chemical spray is initially incident the center region of the wafer and subsequently incident a second edge region of the wafer, the second edge region opposing the first edge region, wherein the third direction is parallel and in an opposing direction to the first direction.

13. A method of semiconductor fabrication, the method comprising:
providing a semiconductor substrate having a first region with a first edge and a second region with a second edge, the second edge opposing the first edge, wherein the semiconductor substrate includes a pattern of interconnect or gate structure lines extending in a first direction and having a passage interposing each line of the pattern of lines;

providing a first spray bar spaced a distance above the semiconductor substrate;

dispensing a first cleaning chemical spray from the first spray bar for a first time period;

during the dispensing the first cleaning chemical spray on the pattern of interconnect or gate structure lines and passages, while laterally moving in the first direction, during the first time period, the semiconductor substrate such that the first spray bar traverses over the first region of the semiconductor substrate to the first edge;

after the first time period is expired, dispensing a second cleaning chemical spray from the first spray bar onto the second region of the semiconductor substrate for a second time period;

during the dispensing of the second cleaning chemical spray, laterally moving in a second direction, during the second time period the semiconductor substrate such that the first spray bar traverses over the second region of the semiconductor substrate to the second edge, wherein the second direction is parallel and opposite to the first direction, wherein during the dispensing the first cleaning chemical spray, the first cleaning chemical spray is not incident the second region of the semiconductor substrate and during the dispensing the second cleaning chemical spray, the second cleaning chemical spray is not incident the first region of the semiconductor substrate;

wherein the semiconductor substrate is not rotated during the first time period and not rotated during the second time period.

14. The method of claim 13, wherein the dispensing the first cleaning chemical spray and the dispensing the second cleaning chemical spray provide for a same composition of fluid to be incident the semiconductor substrate.

* * * * *